United States Patent [19]
Yao et al.

[11] Patent Number: 6,074,890
[45] Date of Patent: *Jun. 13, 2000

[54] METHOD OF FABRICATING SUSPENDED SINGLE CRYSTAL SILICON MICRO ELECTRO MECHANICAL SYSTEM (MEMS) DEVICES

[75] Inventors: Jun J. Yao; Sangtae Park, both of Thousand Oaks, Calif.

[73] Assignee: Rockwell Science Center, LLC, Thousand Oaks, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/004,683

[22] Filed: Jan. 8, 1998

[51] Int. Cl.$^7$ .................................................. H01L 21/00
[52] U.S. Cl. ................................ 438/52; 438/48; 438/24
[58] Field of Search .................. 438/52, 48, 24

[56] References Cited

U.S. PATENT DOCUMENTS

| | | | |
|---|---|---|---|
| 5,431,052 | 7/1995 | Bischof et al. | 73/514.32 |
| 5,549,785 | 8/1996 | Sakai et al. | 438/52 |
| 5,578,976 | 11/1996 | Yao | 333/262 |
| 5,616,523 | 4/1997 | Benz et al. | 438/50 |
| 5,629,244 | 5/1997 | Matsuzaki | 438/52 |
| 5,645,684 | 7/1997 | Keller | 148/33.2 |
| 5,660,680 | 8/1997 | Keller | 438/50 |
| 5,725,729 | 3/1998 | Greiff | 438/50 |
| 5,726,073 | 3/1998 | Zhang et al. | 438/20 |
| 5,872,024 | 2/1999 | Fujii et al. | 438/52 |
| 5,882,532 | 3/1999 | Field et al. | 216/2 |
| 5,885,468 | 3/1999 | Kozlowski | 216/2 |
| 5,914,801 | 6/1999 | Dhuler et al. | 359/230 |
| 5,959,516 | 9/1999 | Chang et al. | 334/14 |

OTHER PUBLICATIONS

Thomas Gessner et al., "Silicon mirror arrays fabricated by using bulk– and surface– micromachining", SPIE' 97, pp. 1–10, (1997).

S.M. Sze, editor, VLSI Technology, Second Edition, Silicon on Amorphous Substrates, pp. 88–89, (1988).

Darrin J. Young and Bernhard E. Boser, "A Micromachined Variable Capacitor for Monolithic Low–Noise VCOS," Technical Digest of the 1996 Solid–State Sensor and Actuator Workshop, Hilton Head, South Carolina, pp. 86–89, 1996.

K. Petersen, "Micromechanical Membrane Switches on Silicon", IBM Journal of Research and Development, vol. 23, 1979, pp. 376–385.

M.A. Gretillat et al. "Electrostatic Polysilicon Microrelays Integrated with MOSFETs," proceedings of Micro Electro Mechanical Systems Workshop, 1994, pp. 97–101.

Timothy J. Brosnihan et al., Embedded Interconnect and Electrical Isolation for High–Aspect–Ratio, SOI Inertial Instruments, Transducers '97 1997 International Conference on Solid–State Sensors and Actuators, Chicago, Jun. 16–19, 1997, pp. 637–640.

*Primary Examiner*—John F. Niebling
*Assistant Examiner*—John Murphy
*Attorney, Agent, or Firm*—Koppel & Jacobs

[57] ABSTRACT

A method of fabricating MEMS devices having a master/slave structure in which the motion of a signal device is slaved to a control device through the fabrication of a mechanical coupler. The preferred fabrication uses a backside dry etch to release the suspended MEMS devices and mechanical coupler.

21 Claims, 11 Drawing Sheets

METHOD OF FABRICATING SUSPENDED SINGLE CRYSTAL SILICON MICRO ELECTRO MECHANICAL SYSTEM (MEMS) DEVICES

BACKGROUND OF THE INVENTION

1. Field of the Invention

This invention relates to methods of fabricating single crystal silicon MEMS devices and more specifically to methods of fabricating MEMS devices that are suspended on a silicon-on-insulator (SOI) wafer structure.

2. Description of the Related Art

As the name suggests, MEMS devices are very small electromechanical devices such as switches, capacitors, accelerometers, inductors, capacitive sensors and mechanical actuators that combine many of the most desirable aspects of conventional mechanical and solid-state devices. Unlike conventional mechanical devices, MEMS devices can be monolithically integrated with integrated circuitry while providing much improved insertion loss and electrical isolation over solid-state devices. Typically, the MEMS devices are anchored to and suspended above the substrate so that they can move. For example switches open and close, variable capacitors are trimmed or tuned, actuators move back-and-forth and accelerometers deflect.

Oftentimes these devices perform multiple functions or are simultaneously subjected to more than one signal. For example, low frequency signals are used to open and close MEMS switches and trim or tune variable capacitors while they conduct a high frequency AC signal. Mechanical actuators respond to an electrostatic force produced by a low frequency signal while functioning as an actuator. Accelerometers deflect in response to acceleration forces and in turn modulate an AC signal.

In each of these cases, known MEMS devices are designed to balance the requirements of both functions or signals to improve overall performance. Oftentimes this means that the individual performance of one or more aspects of the device must be sacrificed somewhat. For example, Darrin J. Young and Bernhard E. Boser, "A Micromachined Variable Capacitor for Monolithic Low-Noise VCOS," Technical Digest of the 1996 Solid-State Sensor and Actuator Workshop, Hilton Head, S.C., pp. 86–89, 1996 discloses an aluminum micromachined variable capacitor for use as the tuning element in a voltage-controlled oscillator (VCO). To accurately trim the capacitor you want the surface area to be large and the spring constant to be small. However, to make the capacitor insensitive to fluctuations in the signal voltage you want the surface to be small and the spring constant to be large.

Surface micromachining, modified surface micromachining and frontside silicon-on-insulator (SOI) techniques are among those used to fabricate suspended MEMS devices. Surface micromachining uses standard deposition and patterning techniques to "build-up" the MEMS device on a substrate. Young and Boser's paper, U.S. Pat. No. 5,578,976 entitled "Micro Electromechanical RF switch" and M. A. Gretillat et al. "Electrostatic Polysilicon Microrelays Integrated with MOSFETs," proceedings of Micro Electro Mechanical Systems Workshop, 1994, pages 97–101 describe different MEMS switches that use surface micromachining techniques.

K. Petersen, "Micromechanical Membrane switches on Silicon", IBM Journal of Research and Development, Vol. 23, 1979, pages 376–385 describes a modified surface micromachining technique for fabricating MEMS switches. Deposition and patterning techniques are used to build up the device on the surface of a substrate. The device is then released, i.e. suspended, by etching into the surface of the substrate.

Known SOI techniques etch into the top silicon layer to define the device structure. A frontside hydrofluoric (HF) acid etch removes portions of the buried oxide layer to release the devices from the semiconducting substrate. The frontside HF acid etch is a fast low cost technique for releasing the MEMS devices. However, HF acid etching can cause the suspended structure to stick to the substrate thereby ruining the device. Furthermore, the monolithically integrated circuit can exhibit significant parasitic losses from high frequency AC signals that are coupled through the substrate between devices.

SUMMARY OF THE INVENTION

In view of the above problems, the present invention provides a method of fabricating high quality suspended MEMS devices on an SOI wafer.

This is accomplished by patterning the top silicon layer to form a control device that is anchored to the substrate. A signal device is also formed on the substrate; either in the top silicon with the control device or in a separate deposition layer. A mechanical coupler is fabricated on the SOI substrate between the control and signal devices by patterning an additional deposition layer, the top silicon and/or buried oxide layers or an additional insulator layer in a modified SOI wafer structure. The control and signal devices and the mechanical coupler are released from the insulator layer so that the mechanical coupler slaves the motion of the signal device to the motion of the control device. The devices can be released using a conventional frontside acid etch technique or a novel backside dry etch that reduces parasitics through the substrate.

These and other features and advantages of the invention will be apparent to those skilled in the art from the following detailed description of preferred embodiments, taken together with the accompanying drawings, in which:

DETAILED DESCRIPTION OF THE INVENTION

The present invention provides a method of fabricating a mechanical coupler on an SOI wafer structure that slaves the motion of a signal device to the motion of a control device. The mechanical coupler can be formed by patterning an additional deposition layer, the top silicon and/or buried oxide layers or an additional buried insulator layer in a modified SOI wafer. The devices can be released using the conventional fast low cost frontside acid etch technique or a novel but more expensive backside dry etch technique that reduces parasitic losses and causes less damage to the MEMS devices. The backside etch can also be used to release suspended MEMS devices that are not fabricated in a master-slave configuration.

The fabrication techniques will be described in the context of continuously tunable MEMS capacitors of the types shown in FIGS. 1 and 3 that utilize a master-slave structure in which a control voltage is applied to a master (control) capacitor to set the capacitance of the slave (signal) capacitor that conducts an RF signal via a suspended mechanical coupler. The fabrication of the mechanical coupler allows a user to design the control capacitor to optimize mechanical properties such as tuning sensitivity (large surface area, small spring constant) and the ability to bend without fatiguing and to design the signal capacitor to optimize electrical performance by minimizing sensitivity to the signal voltage and mechanical noise (small surface area, large spring constant) and increasing conductivity. In general, the fabrication techniques used to construct the mechanical coupler are applicable to any master-slave MEMS device configuration and provide similar design benefits by separating the control and signal functions.

Figure 1:
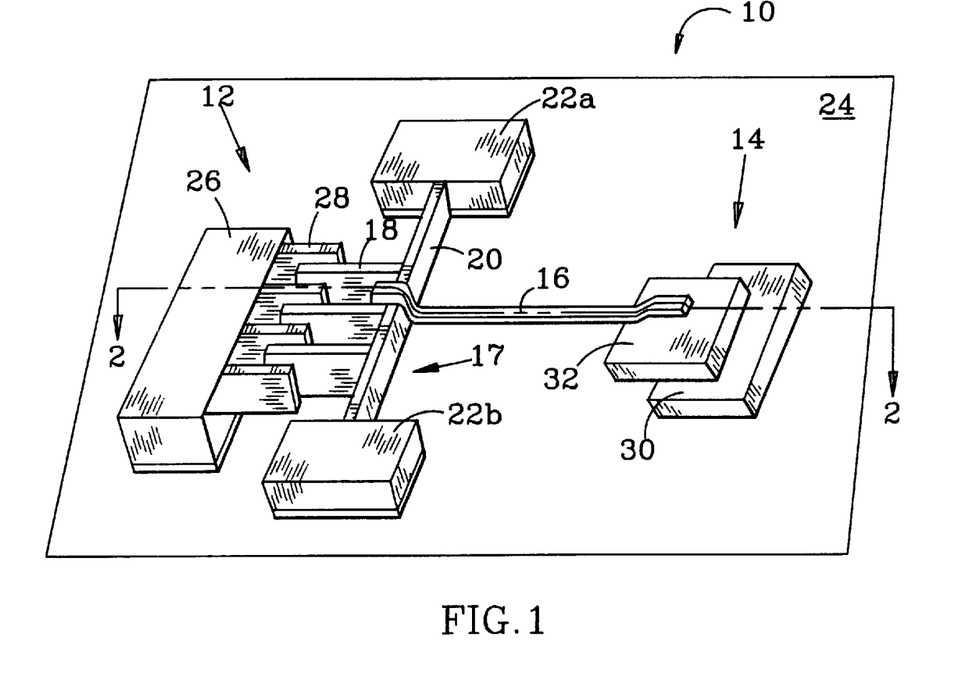
FIG. 1 is a perspective view of a master/slave configuration of a tunable MEMS capacitor fabricated in accordance with the present invention.

The tunable capacitor 10 shown in FIG. 1 is fabricated on an SOI wafer structure by patterning the top silicon layer to define the interdigitated control capacitor 12, patterning metal deposition layers to define the parallel plate signal capacitor 14, patterning a deposition layer to form a mechanical coupler 16, and using a frontside acid etch of the buried oxide layer to release the structures so that the motion of the signal capacitor is slaved to the control capacitor as shown in FIGS. 2a through 2f. In this particular master-slave topology, control capacitor 12 has a movable plate 17 that is formed with fingers 18 on a beam 20 suspended between two contacts 22a and 22b on semiconducting substrate 24 so that beam 20 can flex. A fixed plate 26 is anchored to insulator layer 24 with fingers 28 that are interdigitated with movable plate 17. Signal capacitor 14 has a fixed plate 30 on substrate 24 and a movable plate 32 that is suspended above. Mechanical coupler 16 couples the signal capacitor's movable plate 32 to the control capacitor's movable plate 17. Different combinations of interdigitated and parallel plate capacitors fabricated as horizontal or vertical devices can be used to implement the master-slave topology.

Figure 2A:
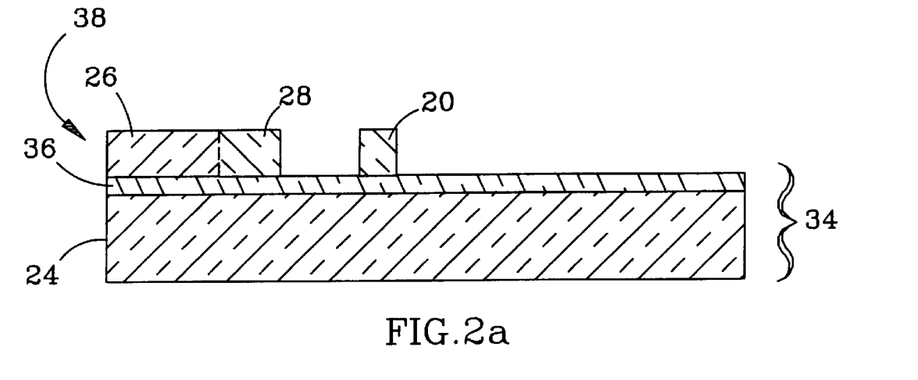
FIGS. 2a through 2f illustrate the fabrication along section 2—2 in FIG. 1 of the tunable MEMS capacitor using a frontside acid release.

As shown in FIGS. 2a through 2f, an SOI wafer 34 comprising substrate 24, a thin buried oxide layer 36 and a top silicon layer 38 is processed to fabricate the tunable capacitor 10 shown in FIG. 1. As shown in FIG. 2a, a photo resist is first patterned with the structural geometry of the control capacitor and then transferred to the top silicon layer 38, which is suitably 10's–100's of microns thick, using reactive ion etching with an anisotropic sidewall profile that stops at the buried oxide layer 36. The etch forms the control capacitor's fixed plate 26 with fingers 28 and beam 20 as shown along this section. The top silicon provides the mechanical properties, e.g., the ability to bend without fatiguing, that are required by the control capacitor. For some applications, the top silicon is conductive enough to provide adequate electrical properties without having to coat the control capacitor with metal.

Figure 2B:
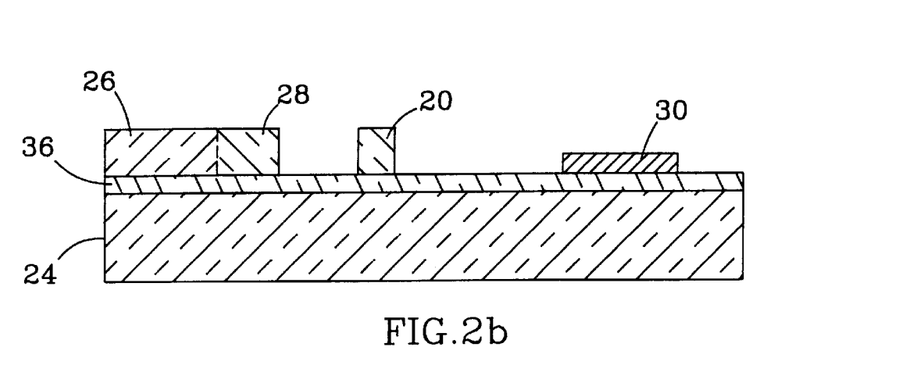
Figure 2C:
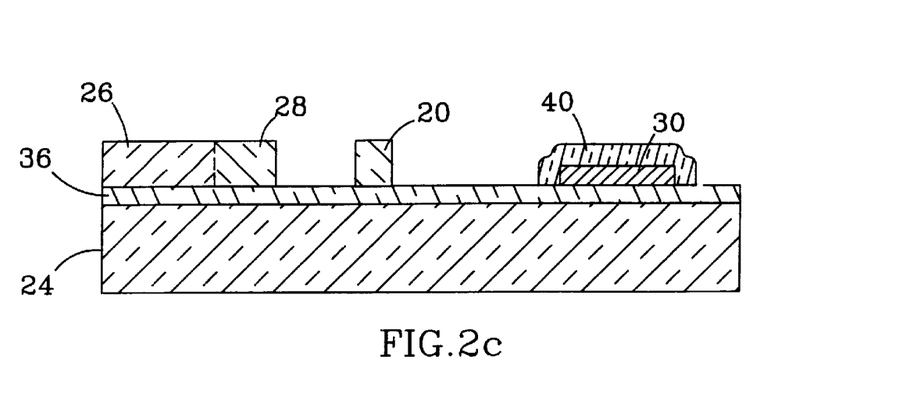
Figure 2D:
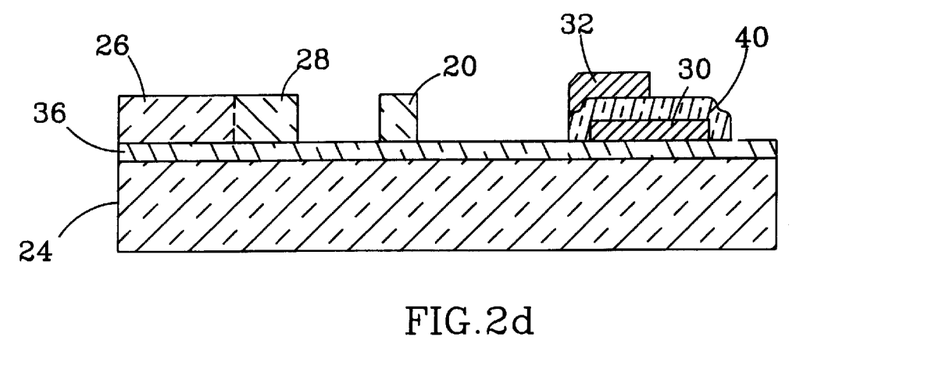

The wafer is then patterned and aluminum deposited to define the signal capacitor's fixed plate 30, suitably a few microns thick, as shown in FIG. 2b. Thereafter, a silicon dioxide spacer layer 40, suitably less than a micron thick, is formed over fixed plate 30 and another aluminum layer, suitably a few microns thick, is deposited thereon to define the signal capacitor's movable plate 32 as shown in FIGS. 2c and 2d, respectively.

Since signal capacitor 14 does not have to bend, it is suitably designed to improve electrical characteristics. First, it's plates are preferably formed from a highly conductive material such as metal, suitably aluminum, or heavily doped polysilicon. Second, the plates' surface area and orientation are selected to reduce the electrostatic force associated with the signal voltage and increase the spring constant that resists that force. Specifically, the signal capacitor's surface area $A_S$ is less than the control capacitor's surface area $A_C$, suitably ½ to ⅒, and the signal capacitor is oriented so that the electrostatic force produced by the signal voltage is orthogonal to the motion of its movable plate 32. As a result, the lateral spring constant set by beam 20 can be relatively small thereby providing a large range of motion and a correspondingly large tuning ratio, suitably 10:1, while the signal capacitor's vertical spring constant can be very large thereby further reducing any deflection caused by the signal voltage.

Figure 2E:
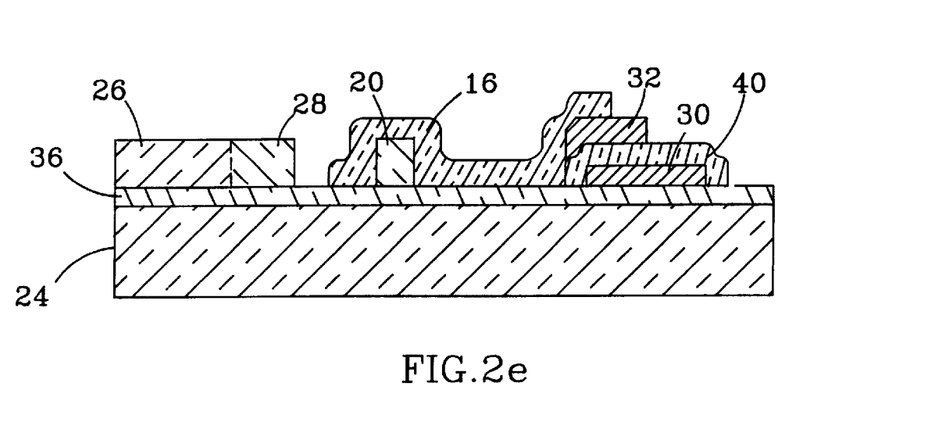

Once the control and signal capacitors are formed, a deposition layer is patterned on the substrate to form mechanical coupler 16 that rigidly couples movable plate 32 to beam 20. The layer is suitably 0.5–2.0 microns thick to provide sufficient rigidity for the signal capacitor's vertical spring constant. Furthermore, the layer is preferably formed from an insulating material such as silicon nitride ($Si_3N_4$) so that the mechanical coupler electrically isolates the control and signal capacitors.

Figure 2F:
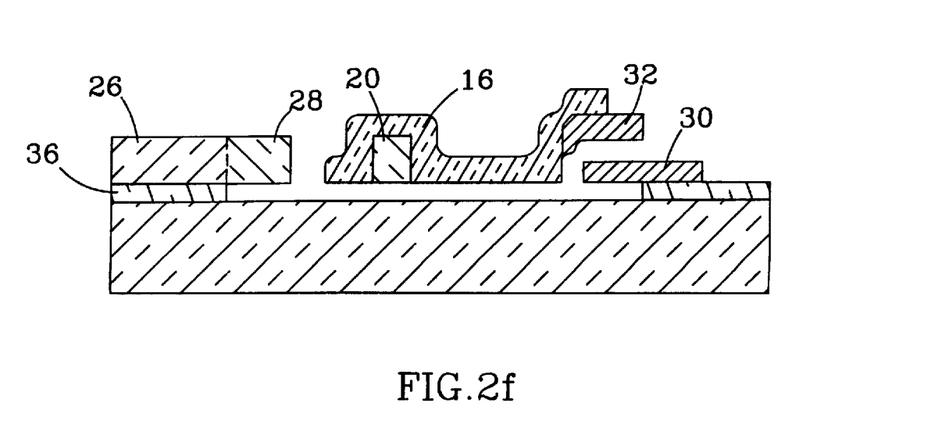

Lastly, the substrate is subjected to a hydrofluoric acid (wet) etch to partially remove the buried oxide 36, leaving the large structures still intact with insulator layer 24 while the small geometry structures are free standing as shown in FIG. 2f. To improve the electrical performance of the tunable capacitor, a metal film can be sputtered without a mask. The metal film would have discontinuities between the silicon structures and the silicon substrate, providing isolation for the devices.

Figure 3:
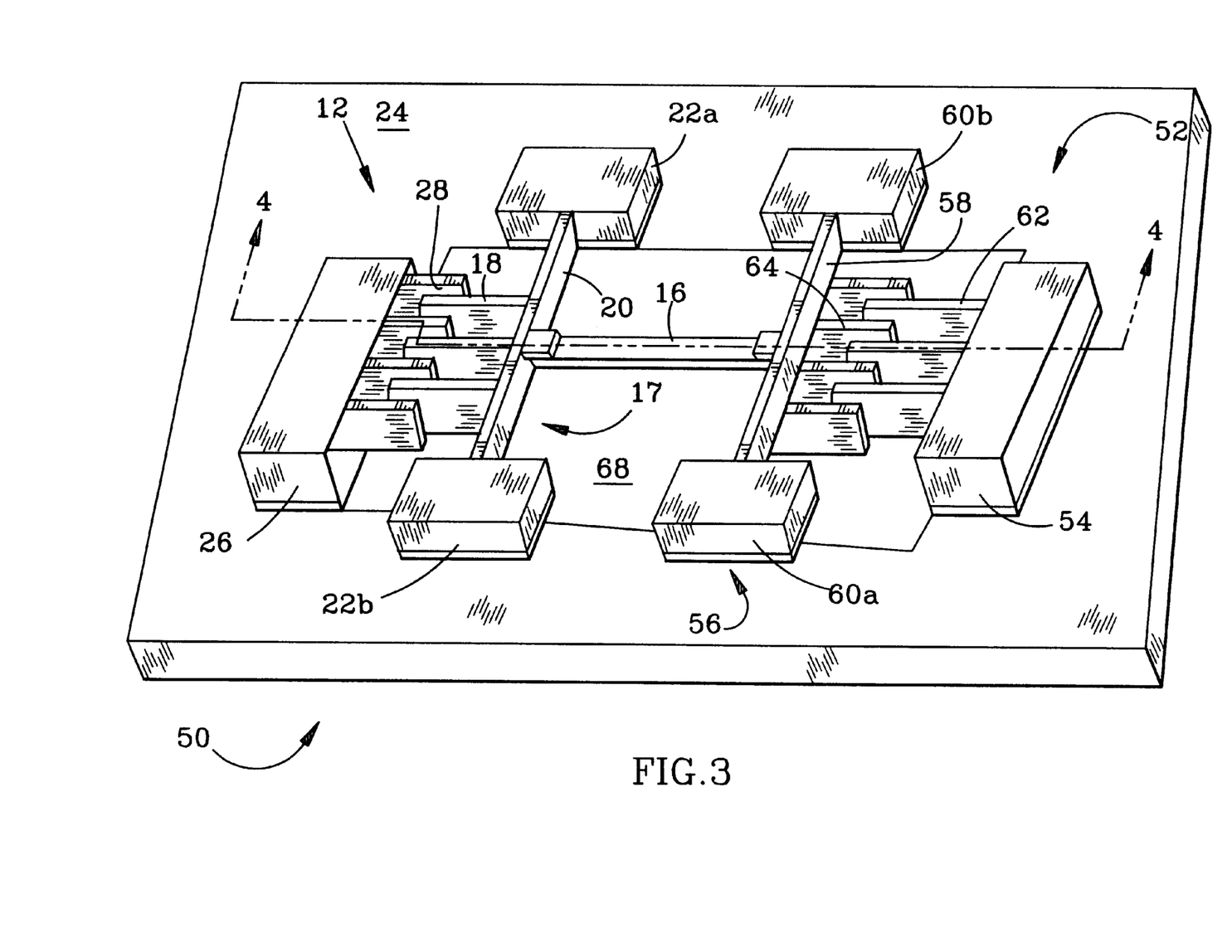
FIG. 3 is a perspective view of an alternate master/slave tunable MEMS capacitor fabricated in accordance with the present invention.

FIG. 3 is an alternate embodiment of a tunable MEMS capacitor 50 in which the parallel plate signal capacitor 14 in the embodiment shown in FIG. 1 has been replaced with an interdigitated signal capacitor 52. Capacitor 52 includes a fixed plate 54 that is anchored to substrate 24 and a movable plate 56 that is formed by suspending a beam 58 between contacts 60a and 60b on substrate 24. Mechanical coupler 16 slaves the motion of beam 58 to the motion of beam 20. In order to make the direction of force on the signal capacitor perpendicular to the direction of motion so that the spring constant can be low in the direction of motion and high in the direction of the force, the fixed and movable plates' interdigitated fingers 62 and 64 are offset so that they are asymmetric. As a result, the force between the fingers dominates the much smaller fringing force.

The advantage to this embodiment is that all of the device structure can be defined when the top silicon is patterned, thus eliminating the steps in FIGS. 2b–d.

Furthermore, as described below, mechanical coupler 16 can also be defined in the top silicon and/or the buried oxide layers using the backside dry etch thereby eliminating the separate processing step shown in FIG. 2e.

The backside fabrication process depicted in FIGS. 4a through 4e for the MEMs tunable capacitor starts out with a Silicon-On-Insulator (SOI) wafer structure 66 which is used for a number of reasons. One reason is that it provides an insulation layer for the device and another reason is that it provides an etch-stop for both the device layer (frontside) and the handle substrate (backside) silicon etches. The backside etch forms a cavity 68 in substrate 24 below the suspended structure that reduces device parasitics and air damping of the mechanical coupler.

The whole fabrication process consists of four masks with three of them used for frontside processing and one for backside processing. The first mask is used to etch about half of the device layer thickness with straight sidewalls. The second mask is used to create a structure which self-isolates and mechanically couples metal on two suspended capacitive structures. The third mask is used for finishing the etch started with the first mask, etching through the device layer. The fourth mask is used to create backside trenches which aid the releasing of the suspendable structures.

Figure 4A:
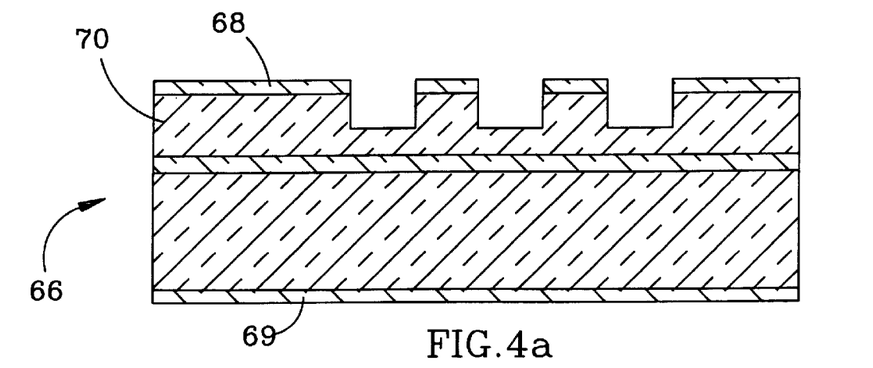
FIGS. 4a through 4e illustrate the fabrication along section 4—4 in FIG. 3 of the tunable MEMS capacitor in the top silicon using a backside etch release.
Figure 4B:
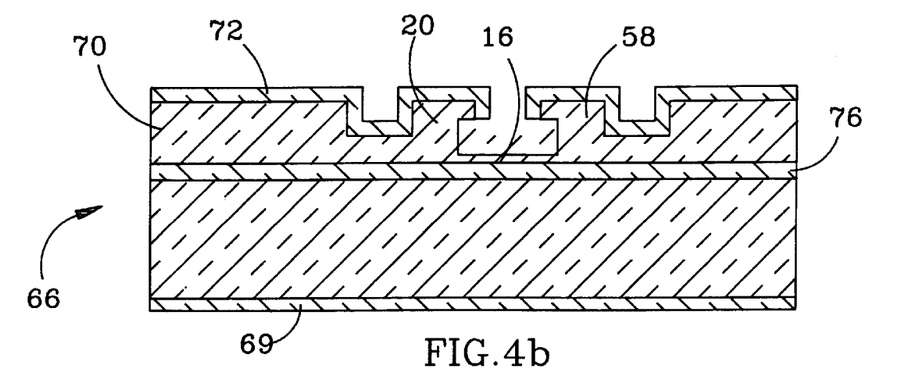
Figure 4C:
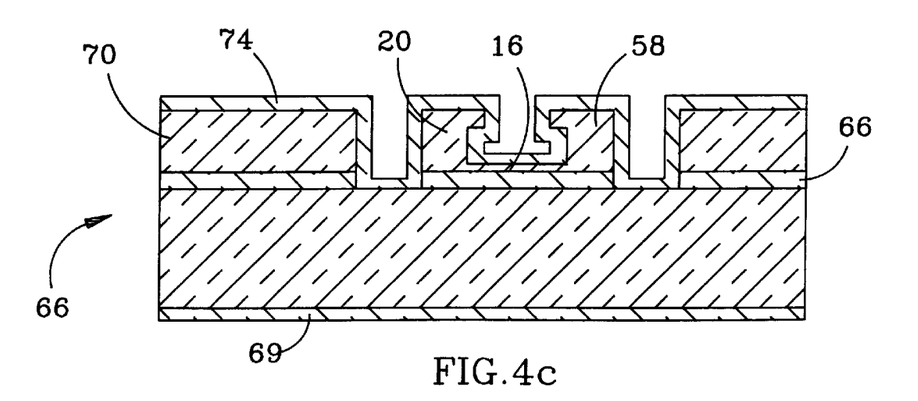

As shown in FIG. 4a, an oxide 69 is grown on both sides of the wafer and, using the photo resist pattern of the first mask, is etched by Reactive Ion Etching (RIE) along with about half of top silicon layer 70 underneath using an Inductively Coupled Plasma (ICP) etcher. As shown in FIG. 4b, another oxide layer 72 is deposited by Plasma Enhanced Chemical Vapor Deposition (PECVD) and patterned using a second mask on the trench floor to prepare the wafer for creating an opening between the beams 20 and 58. with the patterned oxide, an opening is created using an isotropic silicon etch that defines mechanical coupler 16, suitably 0.2–2.0 microns thick. As shown in FIG. 4c, another layer of PECVD oxide 74 is deposited and patterned with the third mask using an RIE etch to electrically isolate the capacitor structures but joining them structurally. Using the same patterned photo resist, the unfinished trench etch is continued to etch through top silicon layer 70 using an ICP etcher. Buried oxide layer 76 is then etched by RIE to physically isolate the suspended structure from the fixed structure and isolation layer 74 is extended to cover the exposed silicon sidewalls using PECVD deposition.

Figure 4D:
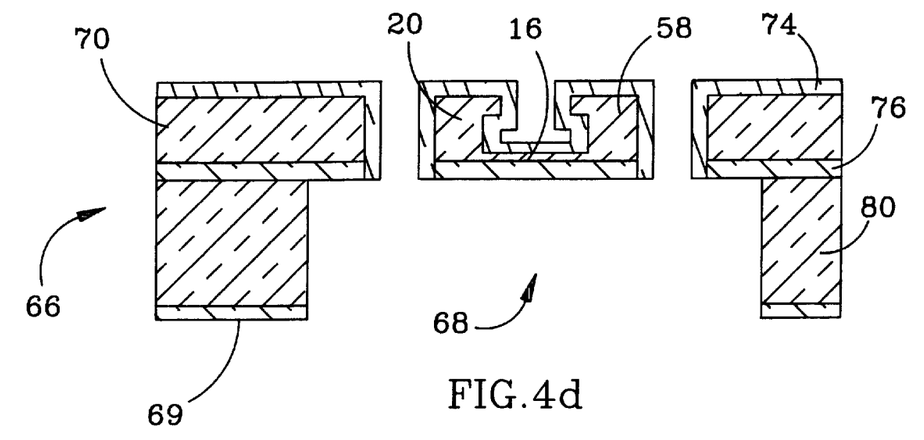

After the frontside process is done, the backside of the substrate is patterned and etched using an ICP etcher to form cavity 68 in substrate 80, which aids the releasing of suspendable structures as shown in FIG. 4d. As shown, the backside etch stops at the buried oxide layer 76 such that mechanical coupler 16 is formed from the top silicon and buried oxide layers. Alternately, the backside etch may remove the buried oxide so that mechanical coupler 16 is formed entirely from the top silicon.

Figure 4E:
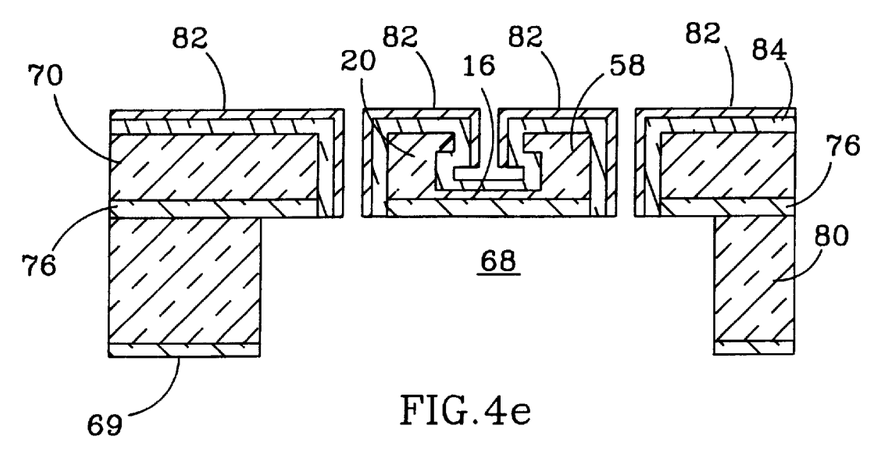

After both the frontside and the backside processes are done, sputtered aluminum 82 is deposited on the frontside as shown in FIG. 4e to form the capacitor structures, which are anchored to the substrate and suspended over cavity 68.

Since mechanical coupler 16 is made from the same material as the capacitor structures, the substrate must be coated with an oxide layer 84 prior to sputtering to provide electrical isolation. No patterning is needed at this point since the metal layers are self-isolated by the undercut structure of the mechanical coupler.

Figure 5A:
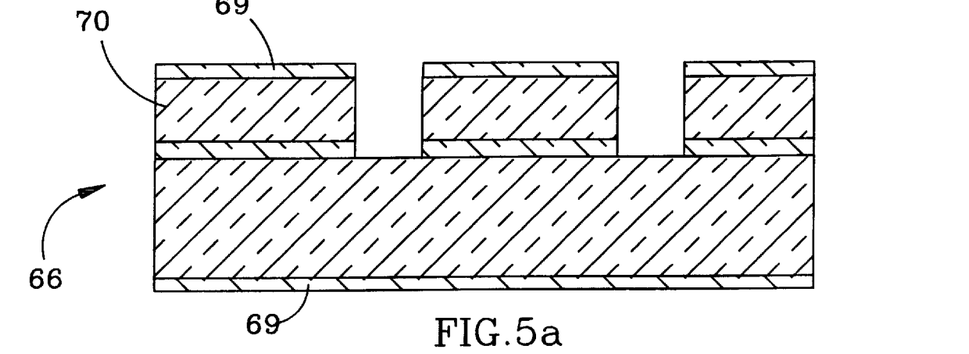
FIGS. 5a through 5c illustrate the fabrication of the tunable MEMS capacitor in which the backside of the substrate is first etched to release the capacitors and then a metal deposition layer is patterned to isolate them.
Figure 5B:
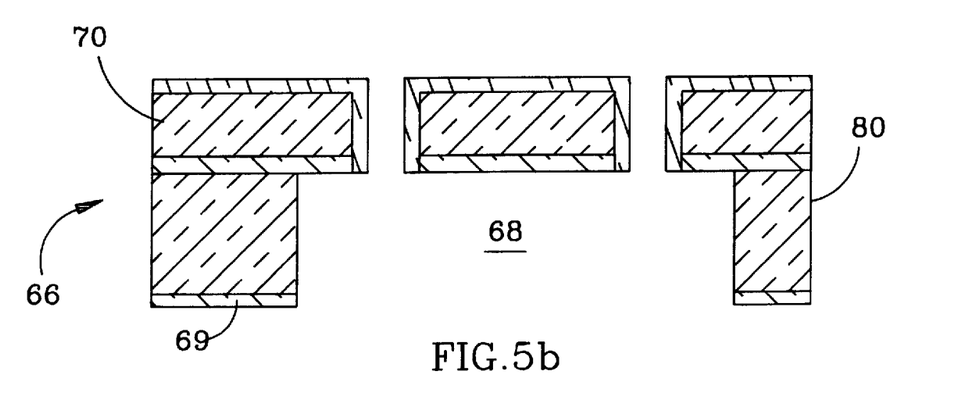
Figure 5C:
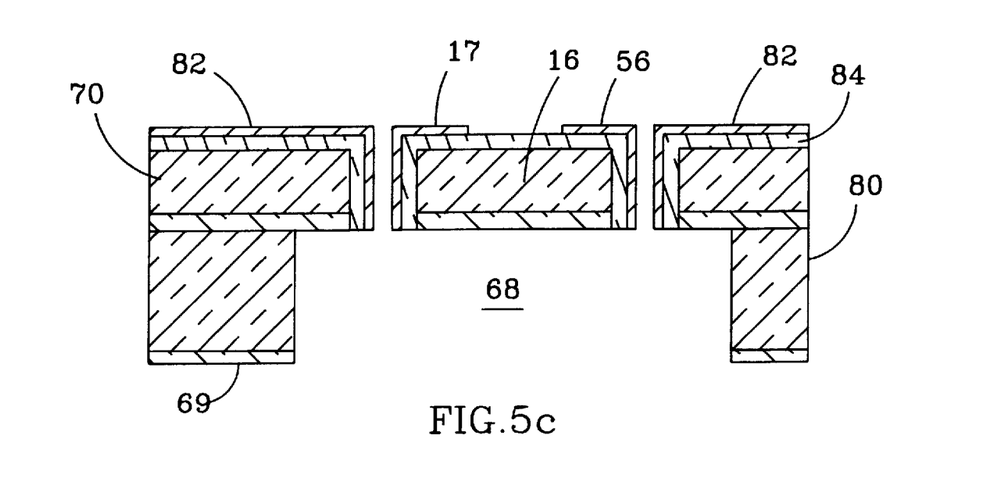

An alternate approach for fabricating mechanical coupler 16 in the top silicon layer is shown in FIGS. 5a–5c. This technique does not provide a self-isolated structure and thus requires patterning of the sputtered aluminum layer 82 in the last step. Specifically, the SOI wafer 66 is patterned through top silicon layer 70 and the buried oxide layer 76 to physically isolate the control and signal capacitors' fixed and movable plates as shown in FIG. 5a. Thereafter, the backside of the substrate is dry etched to form cavity 68 in substrate 80 below the movable plates and mechanical coupler as shown in FIG. 5b. Finally, the substrate is coated with thin oxide 84, sputtered with aluminum layer 82 and then patterned to define the control and signal capacitors' electrically isolated movable plate 17 and 56, respectively. In some applications patterning the sputtered layer may be preferred to forming a self-isolating structure.

Figure 6A:
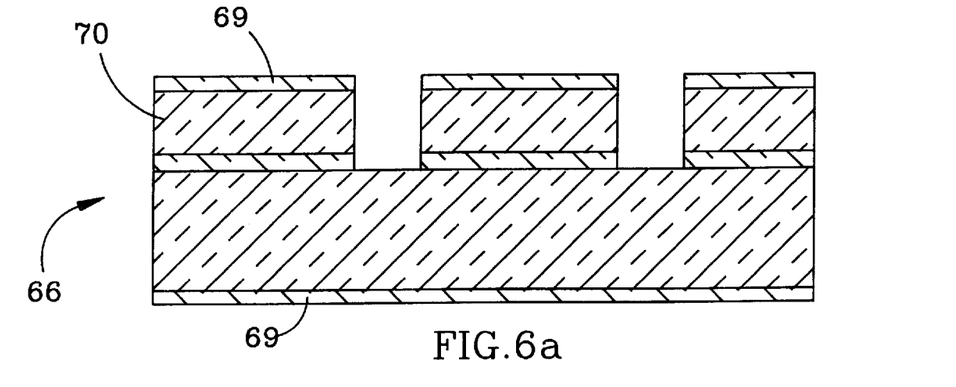
FIGS. 6a through 6c illustrate the fabrication of the tunable MEMS capacitor by patterning a metal deposition layer to isolate the capacitors and then using a backside etch to release them.
Figure 6B:
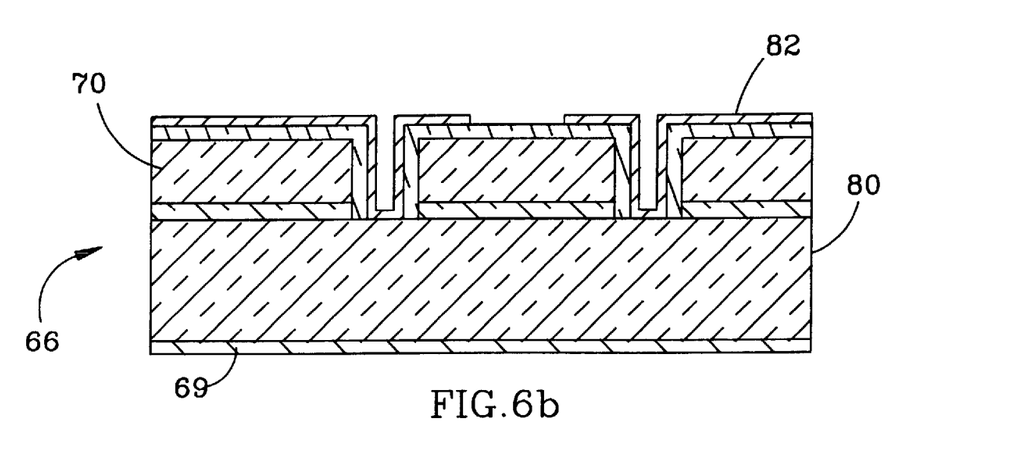
Figure 6C:
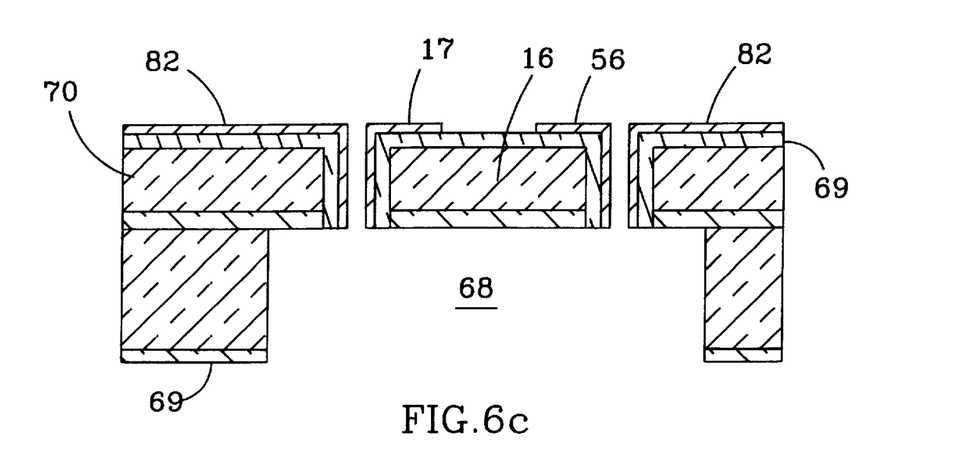

A similar fabrication technique, but one that avoids lithography after substrate removal is illustrated in FIGS. 6a–6c. SOI wafer 66 is patterned through top silicon layer 70 and the buried oxide layer 76 to physically isolate the control and signal capacitors' fixed and movable plates as shown in FIG. 6a. As shown in FIG. 6b, the metal is sputtered onto the topside of the wafer and then patterned and etched to define the control and signal capacitors' electrically isolated movable plate 17 and 56, respectively. Thereafter, the backside of substrate 80 is dry etched to form cavity 68 below the movable plates and mechanical coupler and then the sputtered metal between the fixed and suspended structures is etched as shown in FIG. 6c.

Figure 7A:
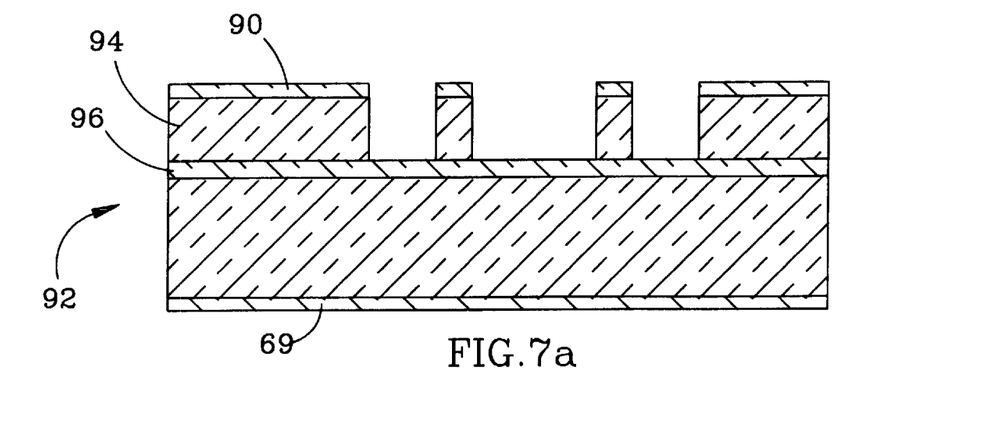
FIGS. 7a through 7c illustrate a frontside process for defining the capacitor's mechanical coupler in the buried oxide and a backside etch for releasing the capacitor.
Figure 7B:
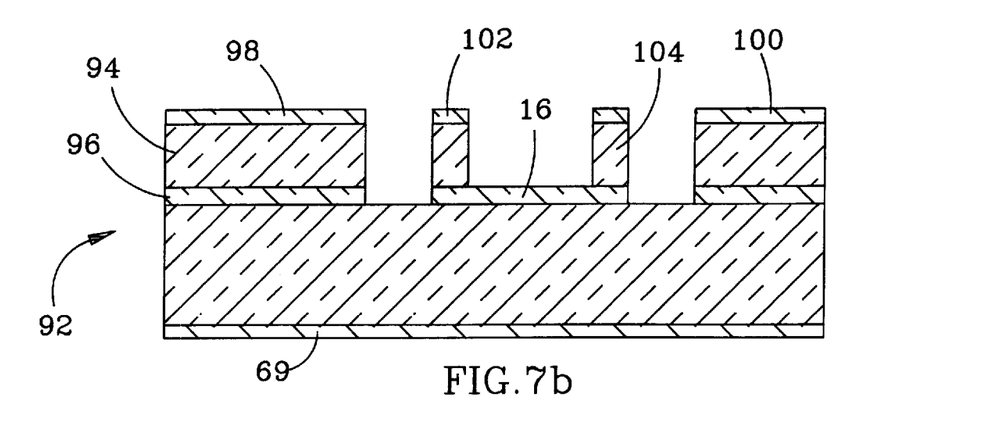
Figure 7C:
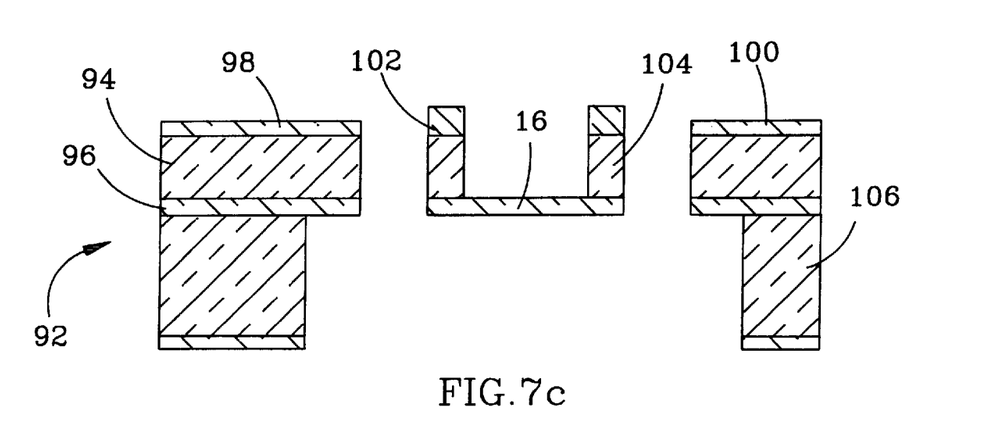

Alternately, the mechanical coupler 16 can be fabricated from only the buried oxide layer. As shown in FIG. 7a, this is accomplished by first sputtering aluminum 90 onto an SOI wafer structure 92 and patterning the top silicon 94 down to buried oxide layer 96. As shown in FIG. 7b, the buried oxide layer 96 is patterned using a combination of photolithography and etching to physically isolate the capacitors' fixed 98,100 and suspended structures 102,104, respectively, and to define mechanical coupler 16. During backside processing, the dry etch through substrate 106 stops at the buried oxide layer 96 thereby releasing the suspended structures 102,104 with the mechanical coupler 16 formed between them as shown in FIG. 7c. Unlike other mechanical coupler structures, the buried oxide only structure cannot be formed using frontside acid etching.

Figure 8A:
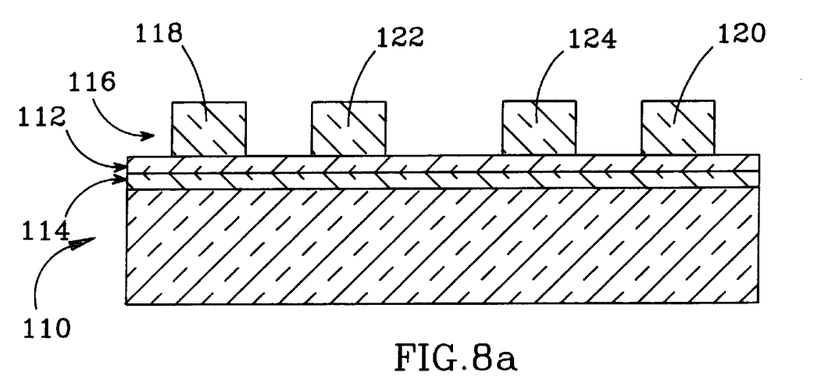
FIGS. 8a through 8d illustrate a backside process for fabricating a mechanical coupler from a modified SOI wafer that electrically isolates a pair of suspended MEMS devices.
Figure 8B:
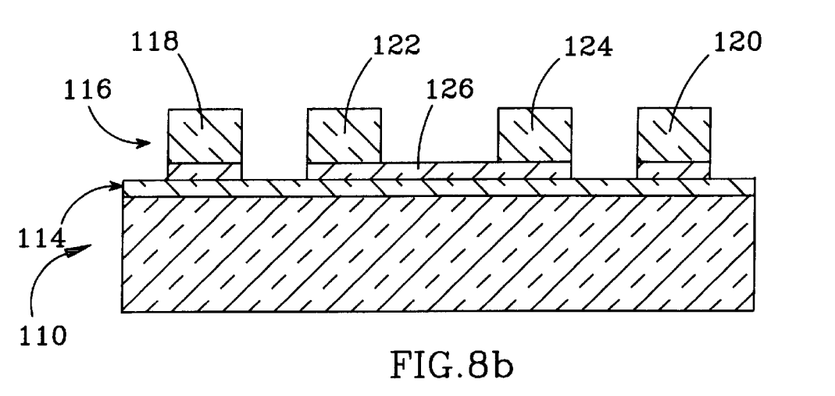
Figure 8C:
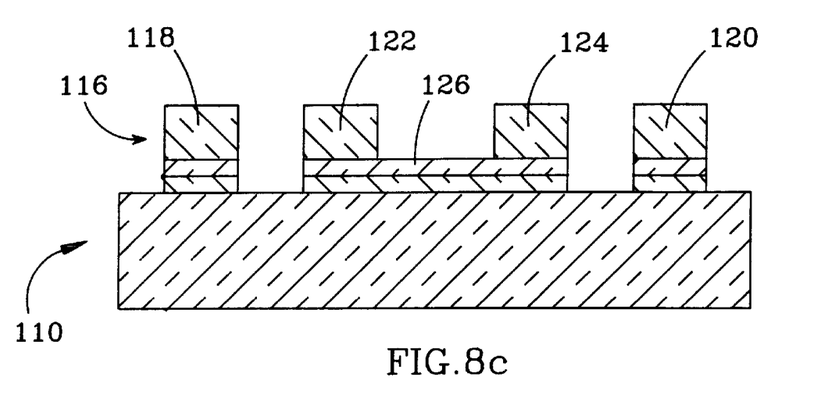
Figure 8D:
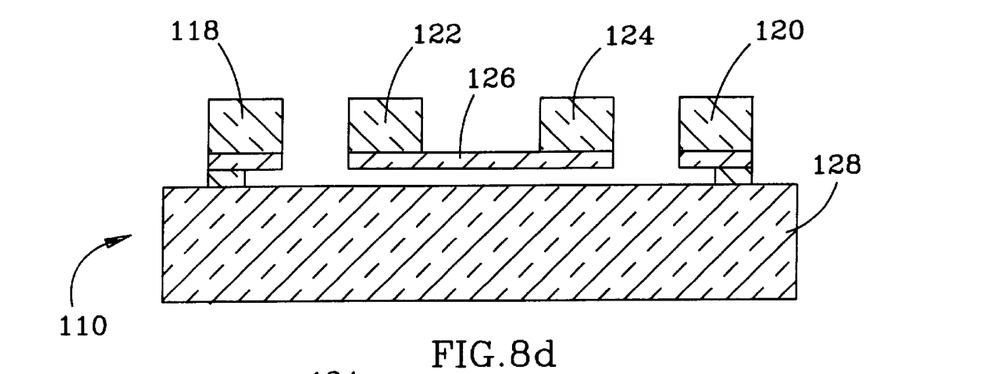

Another approach to fabricating a mechanical coupler is to modify the SOI wafer 110 by forming an additional deposition layer 112 between the buried oxide layer 114 and the top silicon layer 116. As shown in FIG. 8a, top silicon layer 116 is patterned to define the control and signal capacitors' fixed 118,120 and movable 122,124 plates, respectively. Thereafter, a layer 112, suitably an insulating material such as silicon nitride, is patterned to define a mechanical coupler 126 between movable plates 122 and 124 as shown in FIG. 8b. As shown in FIG. 8c, the exposed portions of buried oxide layer 114 are etched away to physically isolate the suspended structure from the fixed structure. Finally, the buried oxide layer is acid etched to release the suspended structures as shown in FIG. 7d. Alternately, substrate 128 could be dry etched from the backside to release the devices.

The backside dry etch can also be used to release individual MEMS devices thereby reducing the associate parasitic losses and, in some cases, reducing the air damping effect caused by the close proximity of the underlying substrate to the suspended structure. To illustrate the applicability of the backside dry etch, the fabrication steps of a MEMS spring 130, which may be used as an accelerometer for example, are illustrated in FIGS. 9a–9c.

Figure 9A:
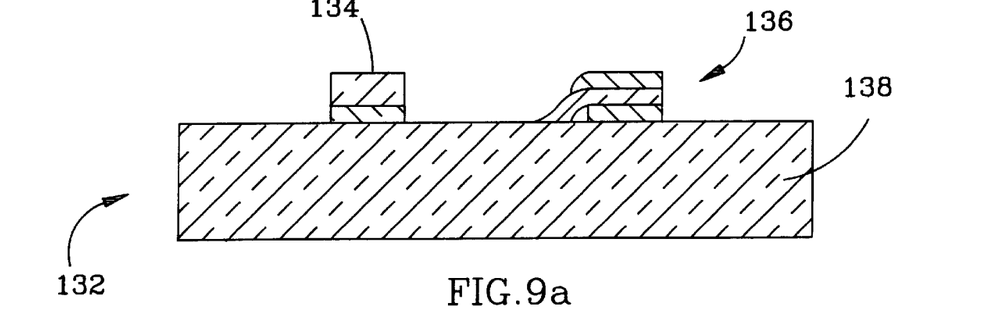
FIGS. 9a through 9c illustrate the fabrication of a mechanical spring using a backside etch release.
Figure 9B:
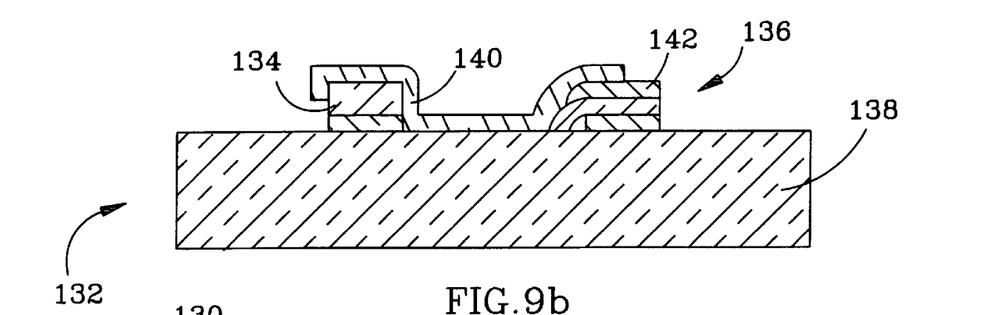

As shown in FIG. 9a, an SOI wafer structure 132 has been patterned to define a contact 134 in the top silicon layer and then patterned to define a parallel capacitor 136 on substrate 138. As shown in FIG. 8a, a deposition layer such as silicon nitride has been patterned to define a structure 140 that connects top plate 142 to contact 134 and the buried oxide removed to suspended top plate 142. In different applications, the entire MEMS structure may be patterned from the top silicon as an integral structure that is anchored to and suspended above the substrate.

Figure 9C:
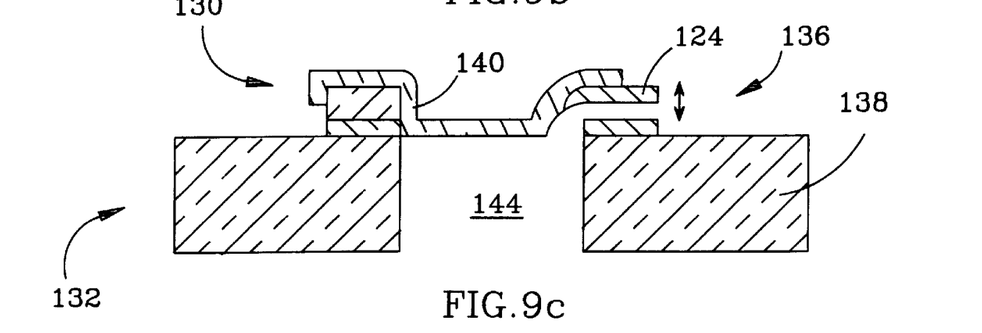

Thereafter, a backside dry etch is performed to remove a portion of substrate 138 to release structure 140 as shown in FIG. 9c. Although slower and more expensive than a frontside acid etch, the backside etch severs the path through the substrate between devices thereby reducing parasitic loss. Furthermore, in the described spring, top plate 142 moves up-and-down in response to an acceleration force thereby modulating the capacitance, which can be read out and used to determine the acceleration. The formation of a cavity 144 below the spring reduces the air damping effect that would otherwise be associated with substrate 138.

Figure 10:
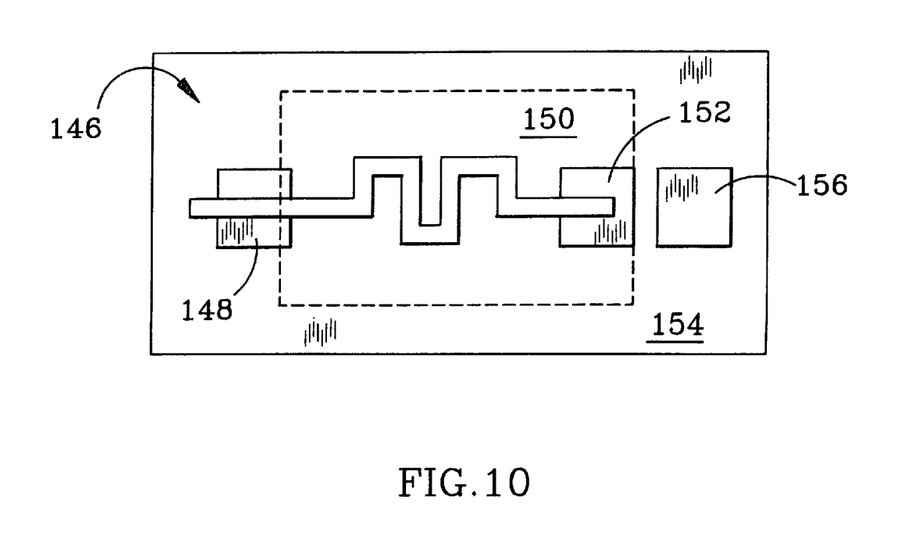
FIG. 10 is a plan view of an alternate mechanical spring design.

FIG. 10 depicts a folded-cantilever type spring 146 that was fabricated using the backside dry etch approach. Spring 146 extends from contact 148 on one side of a cavity 150 and over cavity 150 where it is coupled to a movable plate 152. A fixed plate 156 is anchored to substrate 154 on the opposite side of cavity adjacent movable plate 152. A horizontal acceleration force causes the folded-cantilever spring 146 to compress thereby modulating the capacitance.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of fabricating suspended sin-gle crystal silicon micro electro mechanical system (MEMS) devices, comprising:
   providing a Silicon-On-Insulator (SOI) wafer comprising a silicon substrate, a silicon dioxide layer on said substrate, a deposition layer on said silicon dioxide layer and a top silicon layer on said deposition layer;
   patterning said top silicon layer to form a contact that is anchored to said substrate;
   patterning said deposition layer to form a structure on said SOI wafer that, when suspended, forms a signal device with said contact; and
   dry etching the backside of said substrate through at least said substrate to release said structure formed in said deposition layer so that it is suspended above a cavity formed in the substrate.

2. The method of claim 1, wherein said SOI substrate is dry etched through said substrate and buried oxide layer to release the structure formed in said deposition layer so that it is suspended above said cavity formed in the substrate.

3. The method of claim 1, wherein said deposition layer is an insulating material.

4. The method of claim 3, wherein said deposition layer is silicon nitride.

5. A method of fabricating suspended single crystal silicon micro electro mechanical system (MEMS) devices, comprising:
   providing a Silicon-On-Insulator (SOI) wafer structure comprising a silicon substrate, a silicon dioxide layer and a top silicon layer;
   patterning the top silicon layer to form a control device that is anchored to said substrate;
   forming a signal device that is anchored to said substrate;
   forming a mechanical coupler on said substrate between said control and signal devices; and
   releasing portions of the control and signal devices and all of said mechanical coupler so that said control and signal devices are anchored to and suspended above the substrate, the motion of said signal device being slaved to the motion of the control device by the mechanical coupler.

6. The method of claim 5, wherein said signal device is formed by patterning a deposition layer on said SOI wafer structure.

7. The method of claim 5, wherein said signal device is formed when the top silicon layer is patterned to define the control device.

8. The method of claim 5, wherein said control and signal devices are variable capacitors having respective fixed plates on the substrate and respective movable plates suspended above the substrate and coupled to each other by said mechanical coupler.

9. The method of claim 5, wherein said mechanical coupler is formed by depositing and then patterning a layer on said SOI wafer to mechanically couple the suspended portions of said control and signal structures.

10. The method of claim 9, wherein said layer is formed from an insulating material so that said mechanical coupler electrically isolates said control and signal structures.

11. The method of claim 5, wherein said mechanical coupler is formed by patterning the top silicon layer to mechanically couple the suspended portions of said control and signal structures.

12. The method of claim 11, wherein said control and signal structures are electrically isolated by:
   anisotropically etching down through a portion of the top silicon layer thickness to define an opening with approximately straight sidewalls between said control and signal structures;
   isotropically etching a further portion of but. not through the top silicon layer thickness to widen said opening to create a self-isolating structure;
   coating the SOI wafer with an insulating layer; and
   depositing a conductive layer over the SOI wafer so that the control and signal devices are electrically isolated by said insulating layer and the self-isolating structure.

13. The method of claim 12, wherein said control and signal structures are electrically isolated by:
   coating the SOI wafer with an insulating layer;
   depositing a conductive layer over the SOI wafer; and
   patterning the conductive layer so that the control and signal devices are electrically isolated.

14. The method of claim 5, wherein the mechanical coupler is formed by:
   patterning the top silicon layer to expose the buried oxide layer between the control and signal devices;
   patterning the buried oxide layer to physically isolate the suspended portions of the control and signal devices and to form the mechanical coupler between them; and etching through the backside of the insulator layer to the buried oxide layer to release the mechanical coupler.

15. The method of claim 5, wherein said SOI wafer further comprises a thin insulating layer between said buried oxide and top silicon layers, said mechanical coupler being formed by patterning said thin insulating layer to couple said control and signal structures, etching the exposed portions of said buried oxide layer to physically isolate the control and signal devices' suspended structure from their fixed structure.

16. The method of claim 5, wherein the control and signal devices' suspended structure are released using a frontside acid etch that selectively removes portions of the buried oxide layer beneath their suspended structure and the mechanical coupler.

17. The method of claim 5, wherein the control and signal devices' suspended structure are released using a backside dry etch that etches through selected portions of the substrate beneath their suspended structure and the mechanical coupler, said backside etch creating a cavity in the substrate below the suspended structure that reduces parasitic loss between said devices.

18. A method of fabricating suspended single crystal silicon micro electro mechanical system (MEMS) devices, comprising:
   providing a Silicon-On-Insulator (SOI) wafer comprising a silicon substrate, a buried oxide layer and a top silicon layer;
   patterning the top silicon layer to form control and signal devices having suspended structure and fixed structure that are anchored to said substrate and a mechanical coupler that rigidly connects their suspended structures;
   etching the buried oxide layer to physically isolate the control and signal devices' suspended structure from their fixed structure; and
   dry etching the backside of the substrate to release the control and signal devices' suspended structure and all of said mechanical coupler so that said control and signal devices are anchored to and suspended above the substrate, the motion of said signal device being slaved to the motion of the control device by the mechanical coupler.

19. The method of claim 18, wherein said control and signal structures are electrically isolated by:
   anisotropically etching down through a portion of the top silicon layer thickness to define an opening with approximately straight sidewalls between said control and signal devices' suspended structure;
   isotropically etching a further portion of but not through the top silicon layer thickness to widen said opening to create a self-isolating structure;
   coating the SOI wafer with an insulating layer; and
   depositing a conductive layer over the SOI wafer so that the control and signal devices' suspended structures are electrically isolated by said insulating layer and the self-isolating structure.

20. The method of claim 18, wherein said control and signal devices are electrically isolated by:
   coating the SOI wafer with a thin insulating layer;
   depositing a conductive layer over the SOI wafer; and
   patterning the conductive layer so that the control and signal devices' suspended structures are electrically isolated.

21. The method of claim 18, wherein the mechanical coupler is formed by:
   patterning the top silicon layer to expose the buried oxide layer between the control and signal devices' suspended structures;
   patterning the buried oxide layer to physically isolate the control and signal devices' suspended structures from their fixed structures and to form the mechanical coupler between them; and
   etching through the backside of the substrate to the buried oxide layer to release the mechanical coupler.

\* \* \* \* \*